United States Patent
Fernald

(10) Patent No.: US 7,251,112 B2
(45) Date of Patent: Jul. 31, 2007

(54) BATTERY PROTECT CIRCUIT FOR SWITCHED CIRCUIT THAT SWITCHES BETWEEN A SUPPLY AND A BATTERY

(75) Inventor: Kenneth W. Fernald, Austin, TX (US)

(73) Assignee: Silicon Labs CP, Inc., Austin, TX (US)

( * ) Notice: Subject to any disclaimer, the term of this patent is extended or adjusted under 35 U.S.C. 154(b) by 0 days.

(21) Appl. No.: 10/881,624

(22) Filed: Jun. 30, 2004

(65) Prior Publication Data

US 2006/0002044 A1    Jan. 5, 2006

(51) Int. Cl.
*H02H 3/00* (2006.01)
(52) U.S. Cl. .......................................... 361/82; 361/84
(58) Field of Classification Search .................. 361/82, 361/84; 257/355–363
See application file for complete search history.

(56) References Cited

U.S. PATENT DOCUMENTS

| 3,829,709 | A | * | 8/1974 | Maigret et al. ................ 361/58 |
| 5,783,964 | A | * | 7/1998 | Eitan .......................... 327/408 |
| 6,060,788 | A | * | 5/2000 | Carlson et al. ............ 307/10.8 |

* cited by examiner

*Primary Examiner*—Stephen W. Jackson
*Assistant Examiner*—Dharti H. Patel
(74) *Attorney, Agent, or Firm*—Howison & Arnott, L.L.P.

(57) ABSTRACT

A circuit for protecting a battery includes an n-well formed within a p substrate. A p-type resistor is formed with in the n well and has a connection to the battery. An n+ ring is also formed in the n well and substantially surrounds the p-type resistor.

21 Claims, 2 Drawing Sheets

# BATTERY PROTECT CIRCUIT FOR SWITCHED CIRCUIT THAT SWITCHES BETWEEN A SUPPLY AND A BATTERY

TECHNICAL FIELD OF THE INVENTION

The present invention relates to battery backed up circuits, and more particularly, to circuitry for protecting back up batteries connected to powered circuitry from either damaging such powered circuitry when connected with the wrong polarity or from having main power inadvertently attached to the battery.

BACKGROUND OF THE INVENTION

Volatile circuitry is circuitry which does not retain its stored information when the main power supply to the circuitry is interrupted. Non-volatile circuitry can retain stored information even when the power supply to the circuitry has been interrupted. It is possible to configure volatile circuitry to operate as non-volatile circuitry by providing a backup power supply mechanism to the volatile circuitry. For example, powered volatile circuitry could have a first connection to a power supply source and a second connection to a battery. In the event that the power supply source became unable to provide power to the powered volatile circuitry, the connected battery would begin providing power for the circuitry. This requires some type of intelligent switching circuitry for sensing the difference between the voltage of the battery and the connected power supply and then switching between the connected power supply and the connected battery based upon such sensing operation. When a battery is connected to the powered volatile circuitry, there may arise situations where the battery is incorrectly connected to the associated powered volatile circuitry or when the supply terminal may be shorted to ground. It is important in these situations that some type of circuitry be present to protect the battery from adverse effects when conditions such as these occur. Therefore, there is a need for battery protection circuitry operable with a switching device for interconnecting a connected power supply and connected battery to powered volatile circuitry.

SUMMARY OF THE INVENTION

The present invention disclosed and claimed herein, in one aspect thereof, comprises a circuit for protecting a battery. The structure for protecting the battery includes an n-well formed within a p substrate of a device connected to the battery. A p-type resistor is formed within the n-well and has a connection to the battery. An n+ ring is also formed in the n well and substantially surrounds the p-type resistor to provide the base of a parasitic bipolar transistor that will weakly turn on when the base/emitter junction thereof is forward biased.

DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
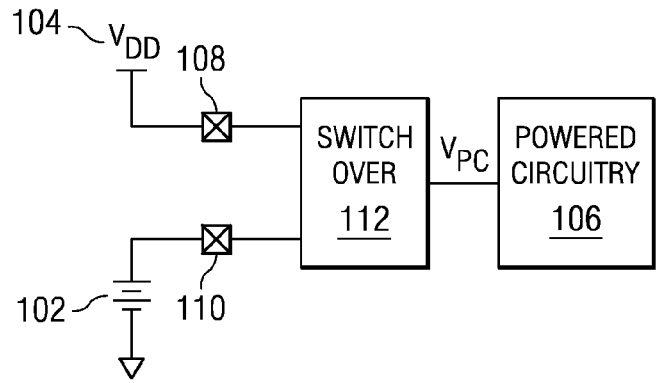
FIG. 1 is a block diagram of a connection between a back up battery and a power supply with powered circuitry through a switch over device.

Referring now to the drawings, and more particular to FIG. 1, there is illustrated the interconnection of a back up battery 102 and a chip power supply providing a voltage $V_{DD}$ 104 to powered circuitry 106. The voltage $V_{DD}$ 104 provided by the power supply is connected to the powered circuitry 106 via a terminal 108. The battery 102 is connected to the circuit via a terminal 110. The battery 102 and the power supply voltage $V_{DD}$ 104 are interconnected with the powered circuitry 106 by a switch over device 112. The switch over device 112 connects either the power supply voltage $V_{DD}$ 104 or the battery 102 to the powered circuitry 106 as a voltage $V_{PC}$. Whether the power supply voltage $V_{DD}$ 104 or the battery 102 are providing the source of voltage $V_{PC}$ from the switch over device 112 depends upon the supply voltage most appropriate to maintain operation of the powered circuitry 106, in this embodiment, the higher of the two. This configuration enables the powered circuitry 106 to operate as non-volatile circuitry. Even if the powered circuitry 106 were volatile circuitry, the powered circuitry 106 will have a substantially continuous power source. In most situations, the power supply will supply the voltage $V_{DD}$. However, if the power supply should fail for any reason, the switch over device 112 will switch to the battery 102 and the power supplied to the powered circuitry 106 will continue. This enables any data stored by the powered circuitry 106 to be protected or any operations performed thereby to continue. However by connecting the battery to the switch over device 112, there exists the possibility of the battery being damaged by certain failure conditions as described herein below.

In one embodiment, the powered circuitry 106 includes a Real Time Clock (RTC) circuit that has a continuously running clock circuit and counter circuitry for maintaining current time status information. The switch over device 112 is a conventional device that utilizes two MOS pass gates as switches and sensing circuitry for sensing the voltage on both the supply input and the battery input. These sensed voltages are compared to each other and, if the supply voltage falls below the battery voltage, then the battery is switched on. There will be some hysteresis associated with this operation.

Figure 2A:
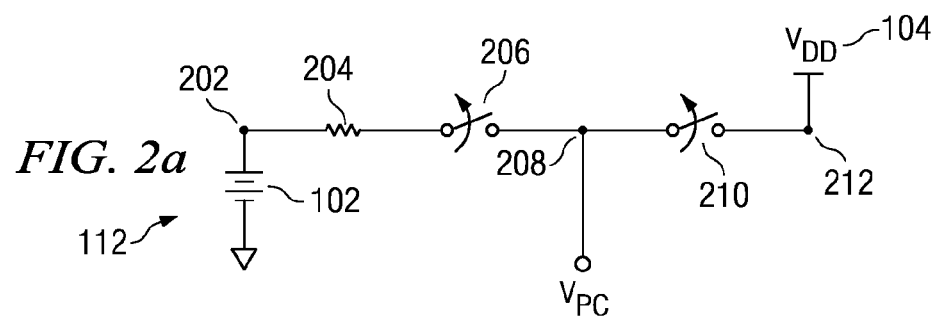
FIGS. 2a-2d, are illustrations of various conditions of the switch over device.

Referring now to FIG. 2a, there is illustrated a functional block diagram of the switch over device 112. As can be seen, the battery 102 is connected to the switch over device 112 at a first node 202. A resistor 204 is connected between node 202 and a first switch 206. The switches 206, 210 may in one embodiment comprise MOS transistors having their base or gate connected to a control circuitry (not shown). The switch 206 interconnects the battery 102 to the powered circuitry 106 to provide the switch over output voltage $V_{PC}$. The switch 206 resides between resistor 204 and node 208, which is the output node of the switch over device 112. Node 208 provides the powered circuitry 106 a voltage $V_{PC}$. A second switch 210 lies between node 208 and node 212. Node 212 connects to the power supply voltage $V_{DD}$ 104. Switch 210 enables $V_{DD}$ to be provided to the powered circuitry as $V_{PC}$. When the control processor closes switch 210 and opens switch 206, the power supply provides $V_{DD}$ as the supply voltage $V_{PC}$. If the control circuitry opens switch 210 and closes switch 206, the battery is the supply voltage for $V_{PC}$.

Figure 2B:
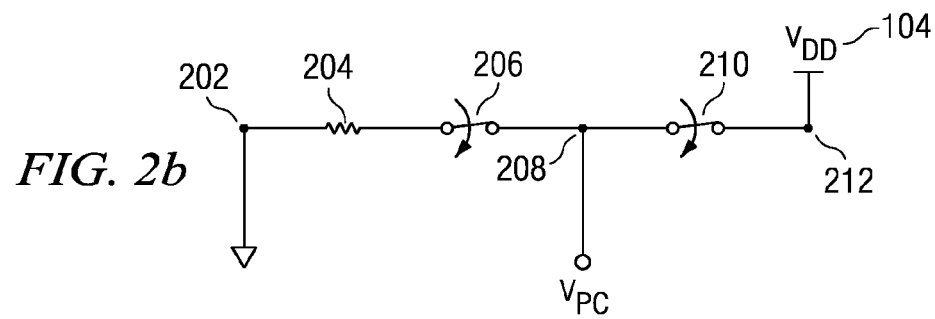

The switch over device 112 may be subjected to a number of improper operating conditions from which the battery 102 must be protected. The first of these is illustrated in FIG. 2b where there is illustrated a situation in which switch 206 and switch 210 are both closed and the battery 102 or the battery terminal 202 has somehow become shorted to ground. As can be seen, the battery is shorted to ground from node 202. Switch 206 residing between resistor 204 and node 208 is closed (possibly due to a failure). Likewise, switch 210 located between node 208 and node 212 is closed (due to the control circuitry determining that node 212 is at a higher voltage than node 202). When the battery 102 is directly shorted to ground, the current drawn from the node 212 through switch 210 (correctly operating) and switch 206 (possibly a failure) may be excessive and damage either the power supply or some other circuitry. The resistor 204 provides a current limiting function in this situation or other similar situations where the short occurs after resistor 204.

Figure 2C:
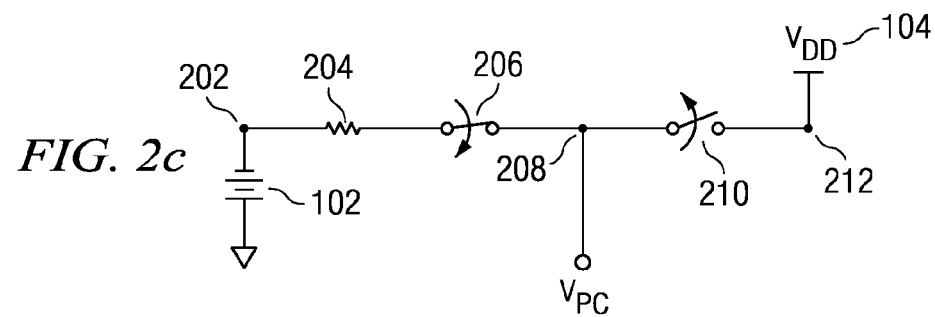

Referring now to FIG. 2c, there is illustrated a second situation in which protection circuitry would be useful for protecting the battery 102. In this case, the battery 102 has been placed the wrong way in its connection with the switch over device 112. As can be seen, battery 102 has the polarity thereof reversed between node 202 and ground. Additionally, switch 206 between resistor 204 and node 208 is closed (possibly due to a failure). Switch 210 between node 208 and node 212 is open (possibly due to a failure or the removal of the power supply voltage). Thus, the battery 102 is connected to switch over device 112 and $V_{PC}$ would be the reverse voltage provided by the battery 102. This configuration could potentially damage the associated circuitry.

Figure 2D:
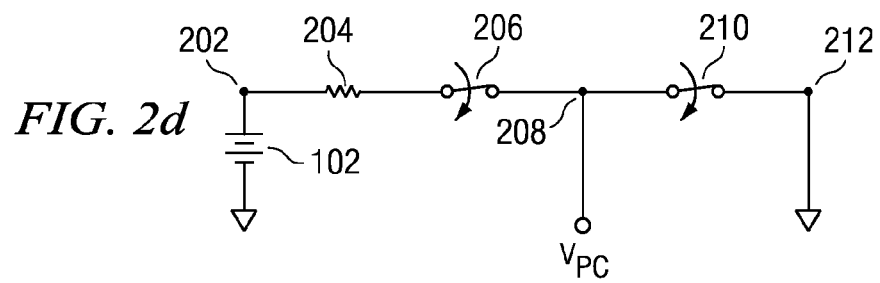

Finally, referring now to FIG. 2d, there is illustrated the situation wherein the power supply voltage $V_{DD}$ 104 has been shorted to ground. As can be seen, both switch 206 connected to resistor 204 and node 208 (due to the lower voltage on the node 212), as well as switch 210 between node 208 and node 212 (due to a possible failure) are closed. Node 212, rather than connecting to the power supply voltage $V_{DD}$ 104 has been shorted to ground. In this configuration, node 208 would be shorted to ground and the resistor 204, although limiting the current drawn from the battery 102, would still draw an excessive amount of current from the battery 102, possibly damaging the battery and/or even causing some environmental harm.

Figure 3:
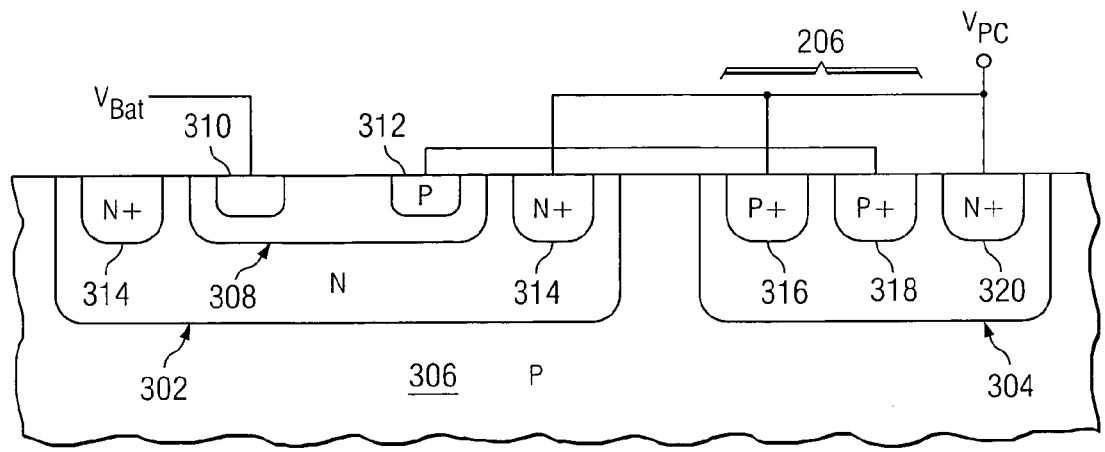
FIG. 3 illustrates a side view of the structure of the battery protection circuit.

Referring now to FIG. 3, there is illustrated a manner for constructing the resistor 204 and switch 206 within a substrate of an integrated circuit that includes the switch 206 and provides protection circuitry for the battery 102. The goal of this structure is to provide current limiting in the event of either a device failure or a reverse polarity battery connect. A pair of n-type wells 302 and 304 are formed in the surface of the p-type substrate 306. The resistor 204 is constructed as a p-resistor in the n-type well 302 by depositing a layer of p-type material 308 within the n-type well 302. A connection to the battery 102 to receive the voltage VBAT is accomplished via a p+ type contact region 310 within the p-type material 308 at one end thereof. A second p+ type contact region 312 within the p-type material 308 provides for interconnection to the switch 206. An n+ type ring 314 within the n-type well 302 surrounds the p-type layer 308 and provides the base of a parasitic PNP transistor comprised of the emitter in region 308, the base in ring 314 and the collector in the substrate 306. The switch 206 is formed within the n-type well 304 as a p-channel MOS transistor consisting of a p+ source/drain 316 and an p+ source/drain 318 (gate not shown) and a contact region 320. The p+ type contact region 312 of the p-type resistor connects with the source/drain 318 of the transistor forming switch 206. The n+ ring 314 connects to the source/drain 316 and n+ contact region 320. N+ ring 314, source/drain 316 and n+ contact region 320 are also connected to the VPC output of the switch over device 112 to connect the well 304 to a high voltage so that the PNP parasitic transistor formed by p+ source/drain 318, n-well 304 and p-type substrate 306 is biased off and the PNP parasitic transistor formed by areas 308, 302, and 306 is biased off.

Figure 4:
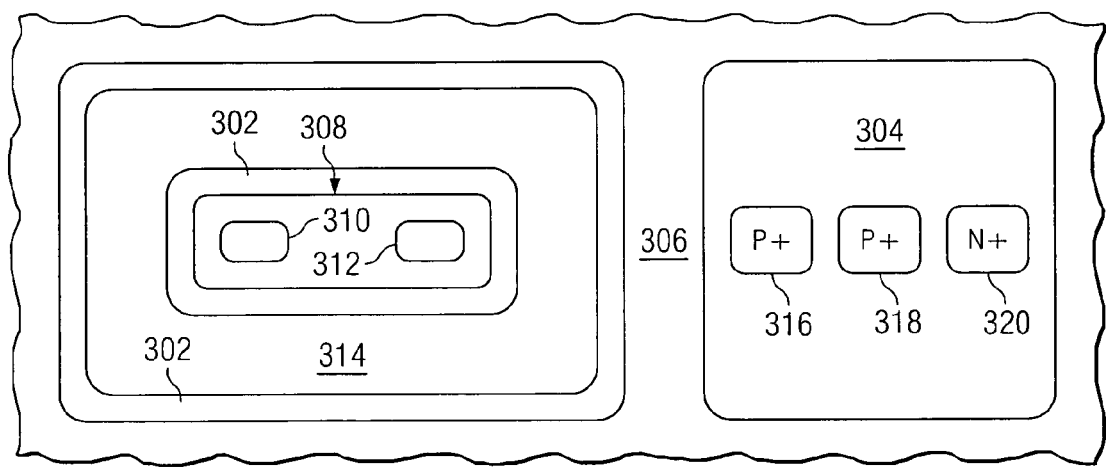
FIG. 4 illustrates a top view of the structure of battery protection circuit of FIG. 3.

Referring now to FIG. 4, it is illustrated a top planar view of the substrate 306 containing the battery protection device. It can be seen that the resistor region 308 is an elongated region to provide the appropriate resistance. As noted herein above, this is a region of p-type conductivity material that is defused into the substrate. The purpose is to define an appropriate semiconductor resistor. The built-in level of the p-type material determines the sheet resistance of the resistor. Since, as noted herein above, there is a PNP parasitic transistor associated therewith, it is necessary to attach the well 302 to a positive voltage. This is facilitated, as noted further herein above, by insuring that the well at the ring 314 is connected to a higher voltage. As long as this is connected to a higher voltage, then the PNP transistor will be maintained in an "off" condition, i.e., the emitter-base junction will be reversed biased. The ring 314 is disposed around the p-type resistor region 308 and disposed therefrom by a distance of at least 2.4 microns which increases the resistance of the base whenever the region 314 is disposed at a low voltage and the resistor 308 at any point there along is disposed at a higher voltage. Thus, a current passing from resistor region 308 through the emitter-base junction formed between the p-type resistor region 308 and the well 302 and ring 314 will provide a fairly weak turn on of the parasitic PNP transistor. The purpose of this will be described herein below.

The p-resistor and the N-well 302 forms a reversed bias junction with the substrate when the battery is connected with a reverse polarity. Since the resistor is created with a p-material in order to create a back biased diode during a short, a parasitic PNP resistor is created between the p-resistor 308, the n-well 302 and the p-substrate 306. If the gate of this parasitic PNP transistor were grounded, a current path to the battery could be created. The n+ ring 314 is used to create a resistance at the base of the parasitic PNP transistor that weekly turns on the parasitic PNP transistor and provides a resistance between the battery and the short to protect from this condition. Thus, the PNP base-to-collector resistance is initially large. This situation is more fully described herein below.

Figure 5:
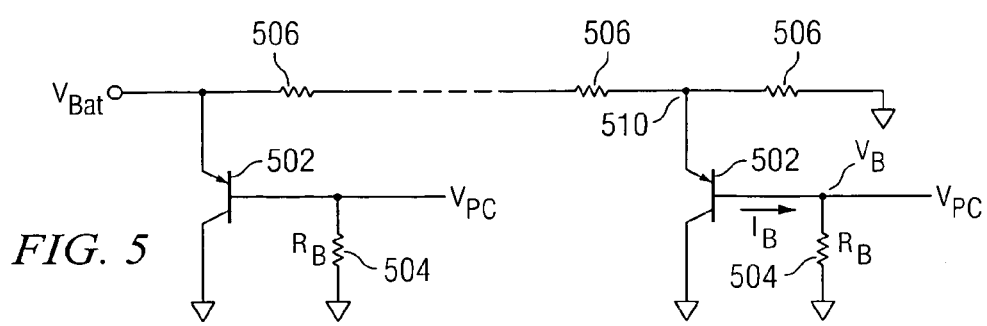
FIG. 5 is a schematic diagram illustrating the battery protection circuit of FIG. 3 in a short circuit condition.

Referring now to FIG. 5, there is a schematic diagram illustrating the resistor structure of the battery protect circuit wherein a condition exists that one end of the resistor associated with the contact region 312 is connected to ground due to the fact that if the switch 210 fails and is closed at the same time that the switch 206 is closed or, for any situation where both switches 206 and 210 are closed and a short occurs on the supply terminal, thus connecting contact region 312 to ground and the ring 314 to ground. The PNP transistor formed by the base portion associated with the ring 314, the P-portion associated with the resistor and the P-portion associated with the substrate results in a plurality of distributed PNP transistors 502 disposed along the length of the resistor region 308. If the potential of the resistor region 308 is constant or if the resistance is very low, then this appears as one large transistor. However, since there is a finite resistance, there will be a distributed resistance and a distributed transistor. Further, when there is a short associated with the contact region 312 or a short associated with the N+ ring 314, then it can be seen that the emitter of each of the transistors 502 will be connected to a different potential. As stated herein above, there is a base resistance 504 associated with each PNP transistor 502 connected between the base and ground. This results in a "weakly" turned on transistor, depending upon the voltage on the emitter. Until the emitter-base voltage exceeds the VBE voltage of 0.7 volts, no current will flow. Thus, there will be a first distributed resistor 504 connected between ground and a node 510 for the first PNP transistor 502 that will be turned on. There are additional resistors 504, these being distributed resistors, disposed between the remaining of the distributed PNP transistors. At the resistors 504 accrue, the voltage on the emitter increases. The voltage across resistor 504 will be the base current times that resistance, which is labeled RB or IBRB to provide a voltage VB. There will be a voltage drop across the distributed resistors 506 up to the emitter of the transistors, such that each of the transistors will be turned on when the voltage is equal to or greater than the VBE+YB. Thus, the resistance decreases as the parasitic transistors 502 get closer to the contact region 310, they will draw more current such that the current is distributed from the resistor region to the ring 314 in a gradient manner.

Although the preferred embodiment has been described in detail, it should be understood that various changes, substitutions and alterations can be made therein without departing from the spirit and scope of the invention as defined by the appended claims.

What is claimed is:

1. A battery protection circuit, comprising:
   a p substrate;
   an n well formed in the p substrate;
   a p resistor having a first connection to the battery formed in the n well and forming a pn junction between the p resistor and the n well;
   an n+ ring formed in the n well and substantially surrounding the p resistor;
   a p channel transistor switch connected to a second connection of the p resistor; and
   wherein a parasitic PNP transistor is formed having an emitter in the p resistor, a base in the n+ ring and a collector in the substrate, the parasitic pnp transistor having a resistor connected to the base.

2. The battery protection circuit of claim 1, wherein the parasitic PNP transistor is weakly turned on responsive to the second connection connecting to ground.

3. The battery protection circuit of claim 1, wherein the parasitic PNP transistor is weakly turned on responsive to the n+ ring connecting to ground.

4. The battery protection circuit of claim 1, wherein a reversed biased diode is formed in the pn junction when a negative potential is applied to the first connection.

5. The battery protection circuit of claim 1, wherein the parasitic PNP transistor is turned off when the n+ ring is connected to a positive voltage.

6. The battery protection circuit of claim 1, wherein the second connection is a p+ connection.

7. The battery protection circuit of claim 1, wherein the first connection is a p+ connection.

8. An apparatus, comprising:
   a first terminal for connecting to a power supply;
   a second terminal for connecting to a battery;
   powered circuitry operable when connecting to either of the power supply or the battery;
   a switching circuit for connecting one of the power supply or the battery to the powered circuitry;
   a battery protection circuit within the switching circuit, said battery protection circuit including:
   a p substrate;
   an n well formed in the p substrate;
   a p resistor having a first connection to the battery formed in the n well and forming a pn junction between the p resistor and the n well;
   an n+ ring formed in the n well and substantially surrounding the p resistor;
   a p channel transistor switch connected to a second connection of the p resistor; and
   wherein a parasitic PNP transistor is formed having an emitter in the p resistor, a base in the n+ ring and a collector in the substrate, the parasitic pnp transistor having a resistor connected to the base.

9. The apparatus of claim 8, wherein the parasitic PNP transistor is weakly turned on responsive to the second connection connecting to ground.

10. The apparatus of claim 8, wherein the parasitic PNP transistor is weakly turned on responsive to the n+ ring connecting to ground.

11. The apparatus of claim 8, wherein a reversed biased diode is formed in the pn junction when a negative potential is applied to the first connection.

12. The apparatus of claim 8, wherein the parasitic PNP transistor is turned off when the n+ ring is connected to a positive voltage.

13. The apparatus of claim 8, wherein the second connection is a p+ connection.

14. The apparatus of claim 8, wherein the first connection is a p+ connection.

15. A switch, comprising:
   a first input for connecting to a power supply;
   a second input for connecting to a battery;
   an output for providing an output voltage; and
   a battery protection circuit for protecting:
      a circuit connected to the output in the event of connecting a battery to the second input in a reverse polarity, and
      a battery connecting to the second input upon the occurrence of shorting of either the first input or the output to ground, such that both backward connection of the battery and shorting of the first input or output are protected against;
   wherein the battery protection circuit further comprises:
   a p substrate,
   an n well formed in the p substrate,
   a p resistor having a first connection to the battery formed in the n well and forming a pn junction between the p resistor and the n well,
   an n+ ring formed in the n well and substantially surrounding the p resistors, and
   a p channel transistor switch connected to a second connection of the p resistor, wherein a parasitic PNP transistor is formed having an emitter in the p resistor, a base in the n+ ring and a collector in the substrate, the parasitic pnp transistor having a resistor connected to the base.

16. The switch of claim 15, wherein the parasitic PNP transistor is weakly turned on responsive to the second connection connecting to ground.

17. The switch of claim 15, wherein the parasitic PNP transistor is weakly turned on responsive to the n+ ring connecting to ground.

18. The switch of claim 15, wherein a reversed biased diode is formed in the pn junction when a negative potential is applied to the first connection.

19. The switch of claim 15, wherein the parasitic PNP transistor is turned off when the n+ ring is connected to a positive voltage.

20. The switch of claim 15, wherein the second connection is a p+ connection.

21. The switch of claim 15, wherein the first connection is a p+ connection.

* * * * *